United States Patent [19]
Shionoya

[11] 3,949,170
[45] Apr. 6, 1976

[54] SIGNAL TRANSMITTING SYSTEM INCLUDING A-D AND D-A CONVERTERS

[75] Inventor: Toshio Shionoya, Tokyo, Japan
[73] Assignee: Sony Corporation, Tokyo, Japan
[22] Filed: Nov. 18, 1974
[21] Appl. No.: 524,810

[30] Foreign Application Priority Data
Nov. 23, 1973 Japan .............................. 48-131914

[52] U.S. Cl. ...... 178/69.5 TV; 178/DIG. 3; 178/68; 340/347 AD
[51] Int. Cl.² ...................................... H03K 13/02
[58] Field of Search.......... 178/68, DIG. 3, DIG. 12, 178/6, 69.5 TV; 340/347 AD, 347 DA; 325/38 R, 38 B; 179/15.55 R

[56] References Cited
UNITED STATES PATENTS

| | | | |
|---|---|---|---|
| 3,244,808 | 4/1966 | Roberts.......................... | 178/DIG. 3 |
| 3,562,420 | 2/1971 | Thompson..................... | 178/DIG. 3 |
| 3,699,446 | 10/1972 | Sainte-Beuve................ | 178/DIG. 3 |
| 3,739,082 | 6/1973 | Lippel............................ | 178/DIG. 3 |

Primary Examiner—Benedict V. Safourek
Attorney, Agent, or Firm—Lewis H. Eslinger; Alvin Sinderbrand

[57] ABSTRACT

A signal transmitting system including an A-D converter for converting an analog input signal to a digital signal and a D-A converter for re-converting the digital signal to an analog output signal is provided with improved fidelity without increasing the number of digital levels and digital bits in the A-D and D-A converters. In such signal transmitting system, the analog input signal is applied to a plurality of voltage level comparators for comparison therein with respective reference voltages which sequentially differ from each other by predetermined voltage increments, the levels of the reference voltages are periodically varied by means of a switching signal, outputs from the level comparators are applied to an encoder which produces a corresponding digital signal, a decoder receives the digital signal and reconverts the latter to an analog signal, and the analog signal from the decoder is added to a switching signal which may be the first mentioned switching signal, or at least has the same period as the latter, to provide a resulting analog output signal which relatively closely corresponds to the analog input signal.

5 Claims, 7 Drawing Figures

SIGNAL TRANSMITTING SYSTEM INCLUDING A-D AND D-A CONVERTERS

BACKGROUND OF THE INVENTION

1. Field of the Invention

This invention relates generally to a signal transmitting system and more particularly is directed to improvements in a signal transmitting system including an analog to digital (A-D) converter and a digital to analog (D-A) converter.

2. Description of the Prior Art

In a prior art signal transmitting system for an analog signal, A-D and D-A converters are used in combination. For example, in such a system, an A-D coverter is used in the transmitter side of the system for converting an analog input signal to a digital signal, and this digital signal is transmitted through a suitable signal handling circuit, such as, a digital memory circuit, to a D-A converter in the receiver side of the system where the digital signal is decoded or demodulated and an analog output signal corresponding to the analog input signal is again obtained.

Such a system is very useful in the field of signal transmission, because the digital signal derived from the A-D converter is easily handled by means of various types of signal transmission.

However, as the analog input signal is twice converted in the A-D and D-A converters, the waveform of the analog output signal is apt to be deformed or does not precisely correspond to that of the analog input signal. Therefore, the fidelity of the system is apt to be insufficient.

In the known system, such deformation in the waveform of the analog output signal is sought to be minimized that is, the fidelity of the system is improved, by increasing the number of digital levels and digital bits in the A-D and D-A converters.

However, the complexity, cost and bulk of the system are all undesirably increased when the numbers of the digital levels and digital bits in the A-D and D-A converters are increased.

OBJECTS OF THE INVENTION

Accordingly, it is an object of the invention to provide an improved signal transmitting system including A-D and D-A converters and which avoids the above described disadvantages inherent in the prior art.

It is another object of the invention to provide a signal transmitting system including A-D and D-A converters and in which the fidelity of the system is much improved without increasing the number of digital levels and digital bits in the A-D and D-A converters.

SUMMARY OF THE INVENTION

The signal transmitting system according to the invention generally comprises and A-D converter which includes a plurality of level comparators and an encoder in combination, and a D-A converter which includes a decoder. The level comparators are supplied with an analog input signal and compare the latter with respective reference voltages which sequentially differ from each other by predetermined voltage increments, and the levels of such reference voltages are periodically varied by means of a switching signal, with the outputs of the comparators being applied to the encoder so that the latter provides a digital signal corresponding to such outputs.

The digital signal from the encoder is transmitted to the decoder and re-converted into an analog signal therein, and a switching signal, the period of which corresponds to that of the first mentioned switching signal, is added to the re-converted analog signal to form a final output signal which relatively closely corresponds to the analog input signal, whereby the fidelity of the system is improved without increasing the number of the digital levels and digital bits in the A-D and D-A converters.

DESCRIPTION OF THE PREFERRED EMBODIMENT

Figure 1:
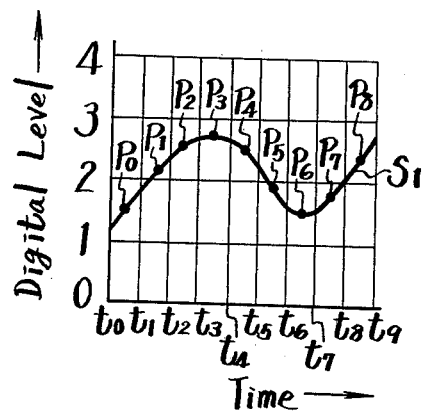
FIGS. 1 and 2 are graphs to which reference will be made in explaining a concept of a prior art signal transmitting system.
Figure 2:
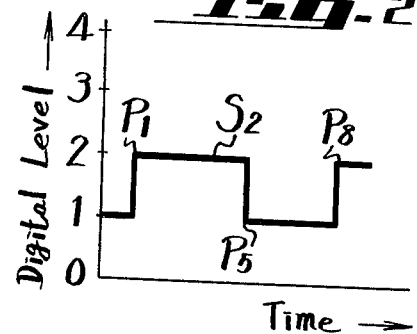

Referring first to FIGS. 1 and 2, in which digital levels of input and output signals, respectively, of a prior art signal transmitting system are plotted on the ordinates and time is plotted on the abscissas, it will be understood that, in such prior art system, an analog input signal $S_1$ (FIG. 1) is sampled by an A-D converter at the points $P_0, P_1, P_2, \ldots$ etc. to provide a corresponding digital signal, whereupon such digital signal is re-converted by a D-A converter into a demodulated or analog output signal, as at $S_2$ on FIG. 2. More specifically, the sampling points $P_0, P_1, P_2, \ldots$ etc. on FIG. 1 are at the midpoints of the respective time intervals $t_0-t_1, t_1-t_2, t_2-t_3, \ldots$ etc. Further, the analog input signal $S_1$ on FIG. 1 is seen to be at a level between the digital levels "1" and "2" at the sampling point $P_0$, while the level of the analog input signal remains between the digital levels "2" and "3" at the sampling points $P_1, P_2, P_3$ and $P_4$, and returns to a level between digital levels "2" and "1" at the sampling point $P_5$ and remains between such digital levels at the sampling points $P_6$ and $P_7$. Therefore, in the case of an analog input signal having the waveform of the signal $S_1$ on FIG. 1, the A-D converter provides a digital signal which represents the digital level "1" in the time interval from the sampling point $P_0$ to the sampling point $P_1$, the digital level "2" in the time interval from the sampling point $P_1$ to the sampling point $P_5$, and the digital level "1" in the time interval from the sampling point $P_5$ to the sampling point $P_8$, at which time the digital signal again represents the digital level "2". Therefore, when such digital signal is demodulated by the D-A converter, the resulting analog output signal $S_2$ has the waveform shown on FIG. 2.

As is apparent from a comparison of FIG. 1 with FIG. 2, the waveform of the demodulated output analog signal $S_2$ differs substantially from that of the original analog input signal $S_1$ with the result that the fidelity of the prior art signal transmitting system is relatively poor. In order to improve the fidelity of such a system, it is generally proposed to increase the number of digital levels, whereby to narrow the distance between the adjacent digital levels. However, in order to increase the number of the digital levels, it is necessary to increase the number of level separators or level comparators used in A-D and D-A converters, and the number of digital bits of an encoder and a decoder used therein is also increased. As a result, the complexity, size and cost of the signal transmitting system are undesirably increased.

As contrasted with the foregoing, a signal transmitting system according to the present invention produces a demodulated output analog signal with high fidelity relative to an original analog input signal without increasing the number of level separator or comparator circuits in the signal transmitting system, and also without increasing the bit number of an encoder and a decoder employed in the system.

Figure 4:
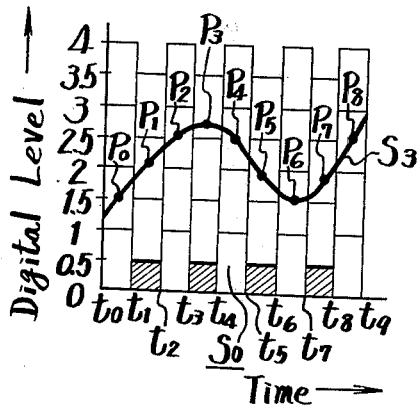
FIGS. 4 to 7 are graphs to which reference will be made in explaining the operation of the system of FIG. 3.
Figure 5:
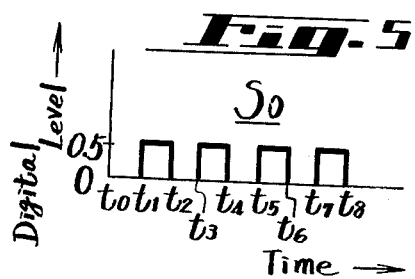

An embodiment of the signal transmitting system according to the present invention will be now described with reference to Figures in which reference numeral 1 designates an input terminal to which an original analog input signal such as, for example, a video signal indicated at $S_3$ on FIG. 4 is applied. Level comparators $C_1, C_2, \ldots C_{15}$ have first input terminals $T_1, T_2, \ldots T_{15}$, respectively, which are connected so that they are supplied with the analog input signal $S_3$ applied to the input terminal 1. A control terminal 2 is supplied with a switching signal $S_0$ which may be a synchronizing signal, such as a vertical synchronizing signal, when the analog input signal $S_3$ is a video signal. This switching signal $S_0$ is a pulse train whose amplitude is increased at every other time interval for example, the time intervals $t_1 \sim t_2$, $t_3 \sim t_4$ . . . . by a voltage corresponding to one-half of a unit digital level, as shown in FIGS. 4 and 5. The switching signal $S_0$ applied to the control terminal 2 is supplied through a phase inverter 3 to the base electrode of an npn-type transistor 4 and also through a variable resistor 5 to the base electrode of an pnp-type transistor 6. The emitter electrode of the transistor 4 is connected to the ground and the collector electrode thereof is connected to a power supply terminal 7 at the voltage +Vcc through a resistor 8 and a variable resistor 9 in series. The movable tap of the variable resistor 9 is connected to the base electrode of an npn-type transistor 10. The collector electrode of the transistor 10 is connected to the power supply terminal 7 and the emitter electrode thereof is connected to the emitter electrode of the transistor 6 through a series circuit of a resistor 11, resistors $R_1, R_2, \ldots, R_{14}$ and a resistor 12 which form a voltage divider network. The collector electrode of the transistor 6 is connected to the ground. Connection points between the resistors 11 and $R_1$, $R_1$ and $R_2, \ldots$ etc., and $R_{14}$ and 12 are connected to second input terminals $T'_1, T'_2, \ldots, T'_{15}$ of the level comparators $C_1, C_2, \ldots, C_{15}$, respectively.

The output signals from the level comparators $C_1, C_2, \ldots, C_{15}$ are respectively applied to a 4-bit encoder 13 and encoded therein to a 4-bit digital signal.

The circuits up to and including the 4-bit encoder 13 are included in the transmitter side of the system and the output digital signal of the 4-bit encoder 13 is suitably transmitted and applied to a decoder 14 which operates as a D-A converter and which is included in the receiver side of the system.

The output signal from the decoder 14 is applied to an input terminal 16 of an adder 15 and another input terminal 17 of the adder 15 is shown to be supplied with the switching signal $S_0$ from the control terminal 2. The signals applied to the input terminals 16 and 17 are added together in the adder 15 and a demodulated analog output signal of the system is obtained at an output terminal 18.

Operation of the signal transmitting system of the invention shown in FIG. 3 will now be described. When the switching signal $S_0$ applied to the control terminal 2 is at its low level, the transistor 4 is made conductive or turned ON, while it transistor 4 is made non-conductive or turned OFF when the switching signal $S_0$ is at its high level. The variable resistor 9 is adjusted so that the emitter voltage of the transistor 10 becomes substantially equal to the power supply voltage +Vcc at terminal 7 when the transistor 4 is non-conductive, and the emitter voltage of the transistor 10 is lowered from the power supply voltage +Vcc by a voltage corresponding to a half of the unit digital level when the transistor 4 is conductive. Further, the variable resistor 5 is adjusted so that, when switching signal $S_0$ is at its high level, the emitter voltage of the transistor 6 is increased, as compared with the emitter voltage of the transistor 6 when the switching signal $S_0$ is at its low level, by a voltage corresponding to a half of the unit digital level. When the variable resistors 9 and 5 are adjusted as described above, the voltage across the voltage divider network formed of the resistors 11, $R_1, R_2, \ldots, R_{14}$ and 12, varies as follows:

When the switching signal $S_0$ is at its high level, the voltages at both ends of the voltage divider network, that is, at the emitter electrodes of transistors 10 and 6, are higher, by a voltage corresponding to one-half of the unit digital level, than the corresponding voltages at the ends of the voltage divider network when the switching signal $S_0$ is at its low level. Further, the voltage drop or difference between the ends of the voltage divider network is the same for both the low and high levels of the switching signal $S_0$.

The resistance values of the resistors 11, $R_1, R_2, \ldots, R_{14}$ and 12 are selected so that the voltages delivered to the input terminals $T'_1, T'_2, \ldots, T'_{15}$ of the level comparators $C_1, C_2, \ldots, C_{15}$ are sequentially decreased by voltage increments each corresponding to the unit digital level. As a result, when the voltages at the emitter electrodes of the transistors 10 and 6 are varied in response to changes in the level of the switching signal $S_0$ as described above, the voltages at the input terminals $T'_1, T'_2, \ldots T'_{15}$ of the level comparators $C_1, C_2, \ldots, C_{15}$ are similarly varied, more specifically, when the switching signal $S_0$ is at its high level, the switching signal $S_0$ being voltages at the input terminals $T'_1, T'_2, \ldots T'_{15}$ are higher, by values each corresponding to one-half of the unit digital level, than the respective voltages when the switching signal $S_0$ is at its low level, and the voltage drops across the respective resistors $R_1, R_2, \ldots R_{14}$ are maintained constant at values corresponding to the unit digital level.

The level comparators $C_1, C_2, \ldots, C_{15}$ operate as follows: The level of the input analog signal applied from the input terminal 1 to the input terminals $T_1, T_2, \ldots, T_{15}$ of the level comparators $C_1, C_2, \ldots, C_{15}$ is compared therein with the levels of the reference voltages applied to their other input terminals $T'_1, T'_2, \ldots, T'_{15}$, respectively, which reference voltages are subsequently decreased in level by the voltage corresponding to the unit digital level or voltage. As a result, if the level of the analog input signal is smaller than the unit digital level, none of the level comparators will produce output signals; if the level of the analog input signal corresponds to one unit digital level, only the level comparator $C_{15}$ will produce an output voltage signal; if the level of the analog input signal corresponds two unit digital levels, the level comparators $C_{15}$ and $C_{14}$ will produce output voltage signals, respectively; and if the level of the analog input signal corresponds to fifteen unit digital levels, all the level comparators $C_1, C_2, \ldots, C_{15}$ will produce output voltage signals. In other words, output signals characteristics of sixteen level steps 0 to 15 are derived from the level comparators $C_1, C_2, \ldots, C_{15}$, and such output signals are applied to the 4-bit encoder 13 to be converted into a 4-bit digital signal which is then transmitted to the D-A decoder 14 at the receiver side of the system to be decoded as the demodulated output signal.

Figure 6:
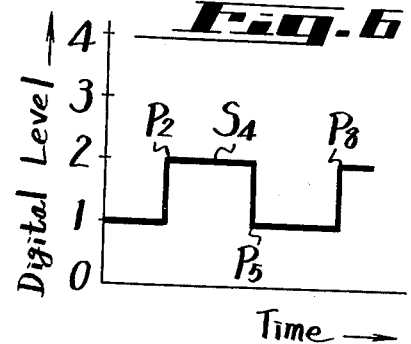

Since the reference voltages applied to the input terminals $T'_1, T'_2, \ldots, T'_{15}$ of the level comparators $C_1, C_2, \ldots, C_{15}$ are increased in level by a voltage corresponding to one-half of the unit digital level at every other time interval, that is, at the odd or even time intervals, the output signal from the decoder 14, that is, the demodulated output signal applied to the input terminal 16 of the adder 15, has the wave form of the signal $S_4$ shown in FIG. 6 when the analog input signal has the wave form of the signal $S_3$ on FIG. 4. In the adder 15, this signal $S_4$ and the switching signal $S_0$ shown in FIG. 5 are added together, so that the demodulated signal $S_5$ shown in FIG. 7 is finally obtained at the output terminal 18 of the system of the present invention.

Figure 7:
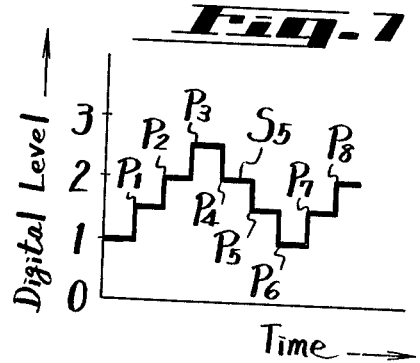

As may be apparent from FIG. 7, in the signal $S_5$, the digital levels midway between the digital levels $0,1,2,\ldots, 15$, that is, the digital levels $0.5, 1.5, 2.5, \ldots, 15.5$ are detected at every other time interval, so that the fidelity of the waveform of the signal $S_5$ relative to the waveform of the original analog input signal $S_3$ is much improved, as compared with the fidelity of the waveform of the signal $S_2$ relative to the waveform of the original analog input signal $S_1$ in the prior art system.

Figure 3:
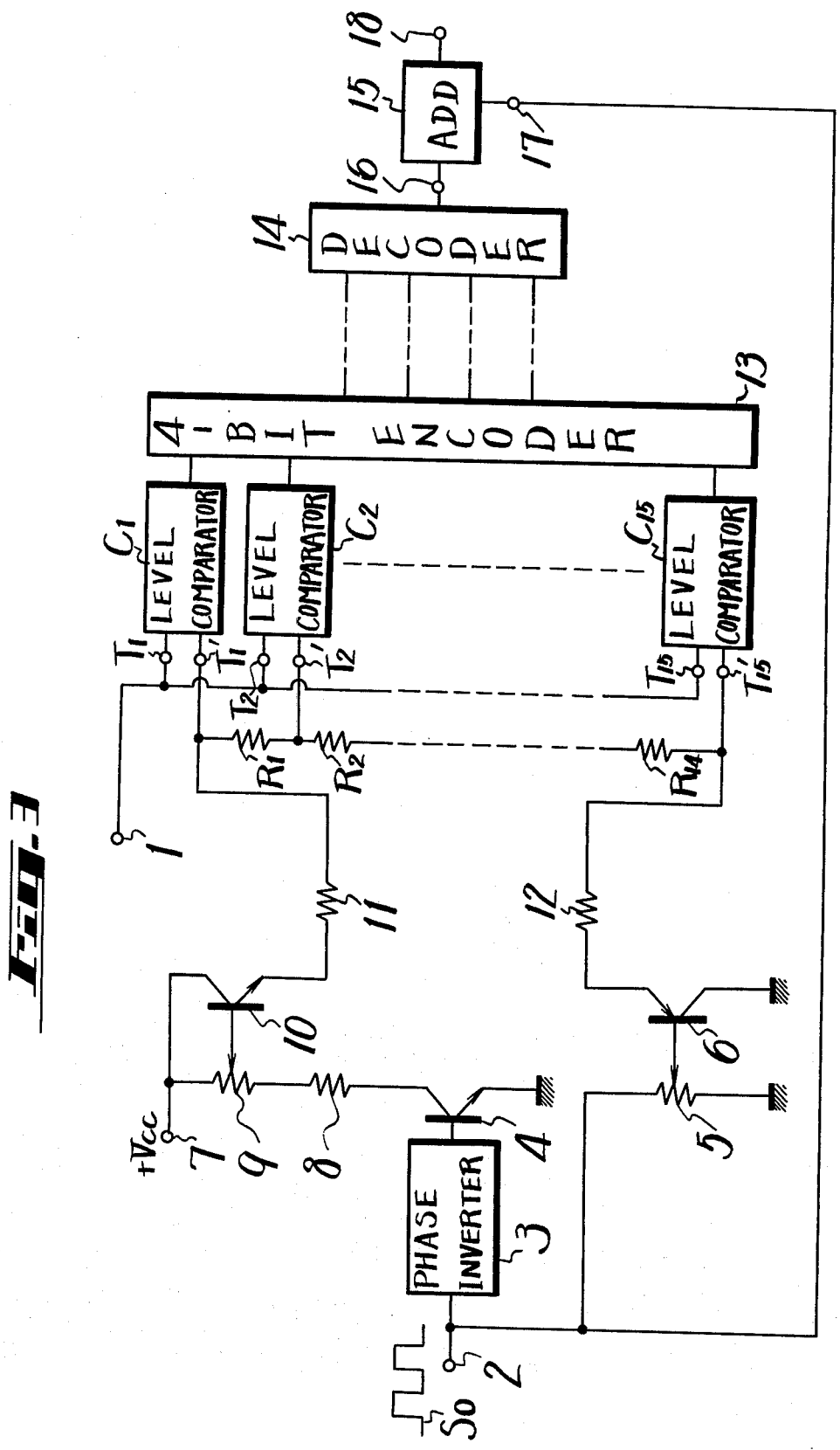
FIG. 3 is a schematic diagram, partially in block form, showing an embodiment of a signal transmitting system according to the present invention.

If the digital levels $0.5, 1.5, 2.5, \ldots, 15.5$ midway between the ordinary digital levels at $0, 1, 2, \ldots, 15$ are to be obtained by the prior art system, there must be provided sixteen level comparators in addition to the fifteen level comparators $C_1, C_2, \ldots, C_{15}$ used in the embodiment of the present invention shown on FIG. 3, and the 4-bit encoder 13 and decoder 14 used in the embodiment of FIG. 3 have to be replaced by a 5-bit encoder and decoder. However, as may be apparent from the above description, with the system of the present invention, the fifteen level comparators, one 4-bit encoder and one 4-bit decoder are capable of handling the equivalent of thirty-two bits of digital information, so that the system according to the present invention is relatively simple.

Although the embodiment of the invention shown in FIG. 3, employs fifteen level comparators, one 4-bit encoder and one 4-bit decoder, it is to be understood that systems according to the present invention may have different members of level comparators and different bit numbers in the encoder and decoder with consequent changes in the fidelity of the analog output signal to the analog input signal.

Further in the above described embodiment, the reference voltages which are, respectively, applied to the input terminals $T'_1, T'_2, \ldots, T'_{15}$ of the level comparators $C_1, C_2, \ldots, C_{15}$ are increased by the voltage corresponding to one-half of the unit digital level at every even time interval, but it is also to be understood that the reference voltages can be similarly increased at every odd time interval.

Further, in the above described embodiment, each reference voltage signal applied to each of the level comparators $C_1, C_2, \ldots, C_{15}$ is increased at every other time interval by a voltage corresponding to one-half of the unit digital level, but it is possible for each reference voltage applied to each of the level comparators $C_1, C_2, \ldots, C_{15}$ to be increased, for example, at every second time interval, by a voltage corresponding to one-third of the unit digital level, or at every third time interval, by a voltage corresponding to two-thirds of the unit digital level. Similarly, it is also possible for each reference voltage applied to each of the level comparators $C_1, C_2, \ldots, C_{15}$ to be increased by a voltage corresponding to ¼, 1/5 . . . . . or any other fraction of the unit digital level. Thus, the use of a switching signal which corresponds to a fraction of the unit digital level makes it possible to very greatly increase the amount of information that can be transmitted without similarly increasing the complexity of the system.

Although the switching signal applied to the input terminal 17 of adder 15 is the same switching signal $S_0$ applied to the A-D converter in the embodiment of FIG. 3, the switching signal applied to terminal 17 may be different from the switching signal $S_0$ so long as it is in synchronism with, that is, has the same period, as the switching signal $S_0$.

Having described a specific embodiment of the invention and several modifications thereof, it is to be understood that the invention is not limited thereto, and that various changes and further modifications may be effected therein by one skilled in the art without departing from the scope or spirit of the invention as defined in the appended claims.

I claim as my invention:

1. A signal transmitting system, comprising: quantizing means for receiving an input analog signal and for quantizing said received input analog signal into levels, said quantizing means comprised of plural level comparators to which said input analog signal is applied in common and to which plural different reference levels are applied, respectively, for comparison with said input analog signal, said reference levels differing from each other sequentially by a predetermined increment; reference level varying means responsive to a periodic switching signal applied thereto for periodically varying the reference level applied to each said level comparator by the same predetermined fraction of said increment, such that each reference level varies periodically between a first level and a second, higher level; an encoder coupled to said quantizing means for digitally encoding the quantized analog signal; a decoder for receiving said digitally encoded quantized analog signal to decode same into a corresponding analog signal; and adder means coupled to said decoder for receiving said corresponding analog signal, said adder means being supplied with a switching signal synchronized with said periodic switching signal, said switching signal periodically varying between a predetermined amplitude and an amplitude greater than said predetermined amplitude by said predetermined fraction of said increment, such that said adder means algebraically adds said switching signal to said corresponding analog signal to produce an output analog signal substantially conforming to said input analog signal.

2. A signal transmitting system according to claim 1; wherein said analog input signal is a video signal, and said periodic switching signals applied to said reference level varying means and to said adder means are synchronizing signals of said video signal.

3. A signal transmitting system according to claim 2; wherein said video synchronizing signal applied to said adder means is the same as said video synchronizing signal applied to said reference level varying means.

4. A signal transmitting system according to claim 3; in which said reference level varying means includes a series circuit of resistors, and means for applying predetermined voltages to the opposite ends of said series circuit so that the voltage drop across each of said resistors is equal to said predetermined increment; a source of said video synchronizing signals; and means for periodically increasing said predetermined voltages applied to said ends of the series circuit by means of said video synchronizing signals.

5. A signal transmitting system according to claim 4 wherein said video synchronizing signal is in synchronism with the vertical synchronizing signal; and said means for applying predetermined voltages to the opposite ends of said series circuit of resistors comprises a first transistor having its collector-emitter circuit connected in series between a DC supply terminal and one end of said series circuit; a second transistor having its collector-emitter circuit connected in series between another DC supply terminal and the opposite end of said series circuit; and means for supplying said video synchronizing signal to the base electrodes of said first and second transistors to simultaneously vary their respective conductivities in complementary manner, whereby the DC voltage across said series circuit is alternatingly increased by said predetermined fraction of said increment.

\* \* \* \* \*